United States Patent
Marijnissen et al.

(12) 
(10) Patent No.: US 6,455,173 B1
(45) Date of Patent: Sep. 24, 2002

(54) THERMAL BARRIER COATING CERAMIC STRUCTURE

(76) Inventors: Gillion Herman Marijnissen, Marisstraat 8, 5986NC, Beringe (NL); Astrid Helennia Francoise van Lieshout, Parallelweg 1B, 5913TK, Venlo (NL); Gerardus Johannes Ticheler, Clematisstraat 22, 5925BE, Venlo (NL); Hendrikus Jacobus Maria Bons, Pater Verhaagstraat 25, 5941BH, Velden (NL); Michiel Leendert Ridder, Herungerstraat 86, 5911AM, Venlo (NL)

( * ) Notice: Subject to any disclaimer, the term of this patent is extended or adjusted under 35 U.S.C. 154(b) by 0 days.

(21) Appl. No.: 09/581,346
(22) PCT Filed: Dec. 9, 1998
(86) PCT No.: PCT/US98/26098
§ 371 (c)(1),
(2), (4) Date: Jan. 16, 2001
(87) PCT Pub. No.: WO99/35306
PCT Pub. Date: Jul. 15, 1999

Related U.S. Application Data

(63) Continuation of application No. 08/987,354, filed on Dec. 9, 1997, now Pat. No. 5,876,860.
(51) Int. Cl.$^7$ .......................... B32B 15/04; C23C 14/08
(52) U.S. Cl. .................... 428/623; 428/629; 428/633; 428/472; 428/701; 427/255.7; 416/241 B
(58) Field of Search .................. 428/623, 628, 428/629, 633, 472, 701, 593, 938, 627, 632, 699, 469; 427/255.7, 419.8; 416/241 B, 241 R

(56) References Cited

U.S. PATENT DOCUMENTS 5,350,599 A * 9/1994 Rigney et al.
6,248,422 B1 * 6/2001 Robbie et al.

* cited by examiner

Primary Examiner—Deborah Jones
Assistant Examiner—Jennifer McNeil

(57) ABSTRACT

A multilayered ceramic topcoat of a thermal barrier coating system is useful for high temperature corrosive applications such as hot section components in gas turbine engines. The ceramic topcoat includes at least two layers, each having generally columnar grain microstructures with different grain orientation directions. A preferred method of producing the multilayered ceramic topcoat includes positioning a superalloy substrate at a first angled orientation relative to a ceramic vapor cloud in an electron beam physical vapor deposition apparatus for a time sufficient to grow a first ceramic layer. The substrate is then reoriented to a second, different angled orientation for a time sufficient to grow a second ceramic layer. The ceramic layers exhibit columnar microstructures having respective grain orientation directions which are related to the first and second substrate orientations. For uniformly coating a complex contoured surface such as a turbine blade airfoil, the blade can be rotated during coating deposition at each angled orientation. Alternatively, the article may be continuously reoriented according to a predetermined speed cycle to produce generally arcuate, sinusoidal, helical, or other columnar grain microstructures.

31 Claims, 6 Drawing Sheets

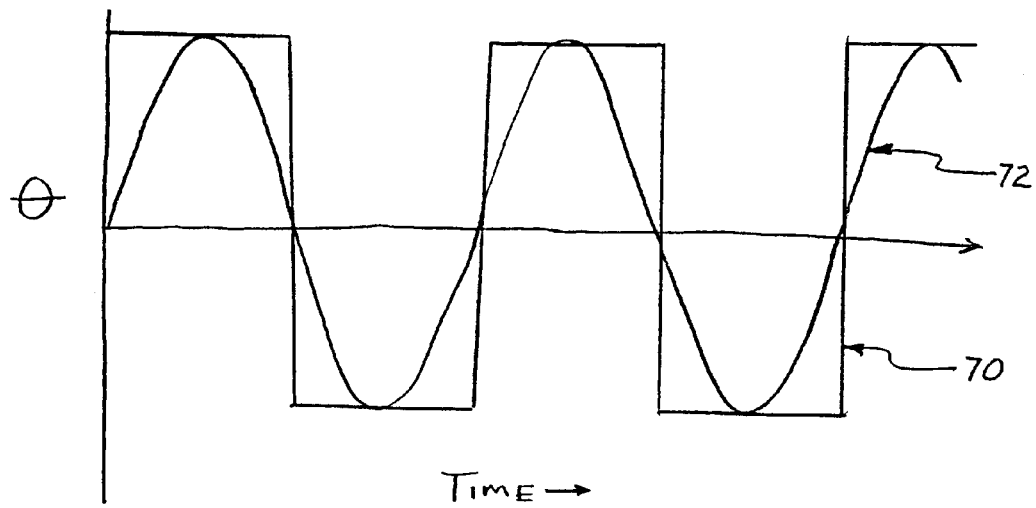
FIG. 7
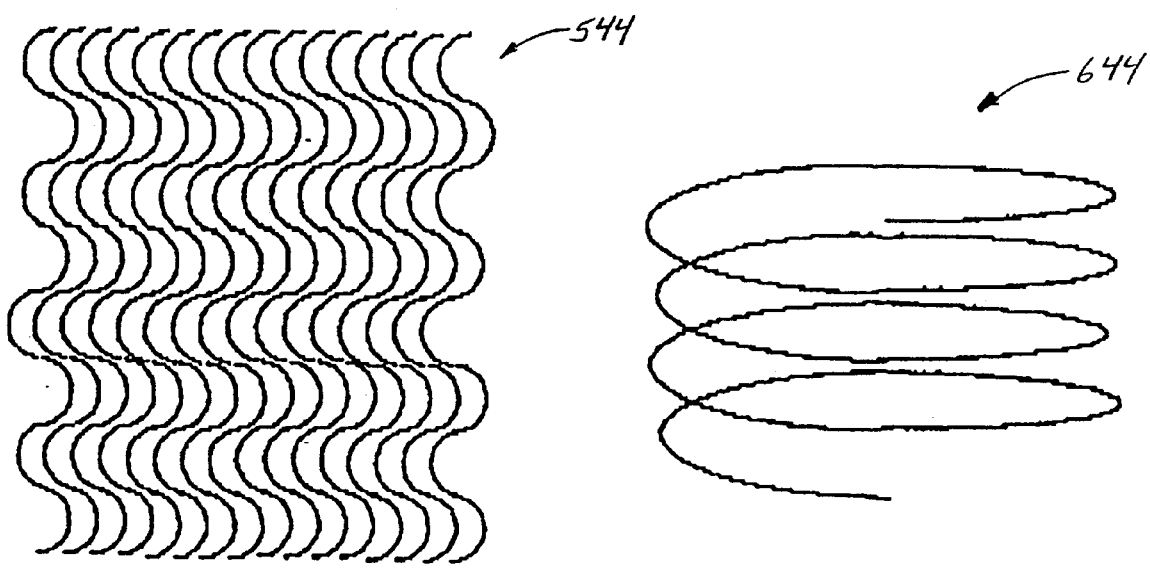
FIG. 8
FIG. 9

THERMAL BARRIER COATING CERAMIC STRUCTURE

RELATED APPLICATIONS

This application is a nationalization of International Application No. PCT/US98/26098, filed on Dec. 9, 1998, which is a continuation of U.S. patent application Ser. No. 08/987,354 filed Dec. 9, 1997, now U.S. Pat. No. 5,876,860, upon which the International Application is based.

TECHNICAL FIELD

The present invention relates to protective coatings for metallic articles and more particularly to an improved ceramic topcoat of a thermal barrier coating system for superalloy substrates.

BACKGROUND INFORMATION

During gas turbine engine operation, hot section components such as combustors, turbine blade and vane airfoils, turbine frames, and exhaust nozzles are subject to oxidizing and corrosive, high temperature combustion effluent gas. Because these components often are subjected concurrently to high magnitude thermally and mechanically induced stress, the art has developed a variety of techniques in the design and manufacture of these components to ensure maintenance of structural and metallurgical integrity throughout the operating range of the engine. For example, components typically are manufactured from material compositions such as nickel- and cobalt-base superalloys having desirable properties at elevated, operating range temperatures. In the case of turbine airfoils, the selected alloy generally is formed by casting. For enhanced high temperature strength, grain structure advantageously may be controlled during solidification of the casting to produce a directionally solidified or single crystal structure, thereby providing greater strength for a given alloy composition.

In addition to component strength enhancement by selection of alloy composition and control of the casting process, both internal and external cooling schemes are employed extensively to maintain component temperatures below critical levels. Tailored film cooling of external surfaces and sophisticated turbulent flow cooling of serpentine shaped internal cavities in the cast airfoils are routinely utilized in advanced gas turbine engine designs respectively to decrease the thermal energy input to the component and reduce the temperature rise thereof. Despite efforts to optimize these varied approaches, both alone and in combination, advanced gas turbine engine efficiency is limited by the inability of the hot section components to achieve acceptable operating lives under increased mechanical and thermal loading.

An additional method employed by those skilled in the art of gas turbine engine design is the use of a relatively thin ceramic insulative outer layer on surfaces exposed to the effluent gas flow. The ceramic coating facilitates component operation at greater operating temperatures. This coating, generally referred to in the industry as a thermal barrier coating ("TBC"), effectively shields the metallic substrate of the component from temperature extremes. By reducing the thermal energy input to the component, higher combustion effluent gas temperatures and/or more efficient use of cooling flows are realized with a resultant increase in engine operating efficiency.

Conventional ceramic coatings are prone to delamination at or near the ceramic/substrate interface due to differences in coefficients of thermal expansion between the relatively brittle ceramic and the more ductile superalloy substrate. The ceramic may spall or separate from the component surface. This failure mechanism is aggravated and accelerated under conditions of thermal cycling inherent in gas turbine engine operation. In order to prevent premature failure of the ceramic, methods of providing strain tolerant ceramic coatings have been developed. Certain moderate service applications employ porous or pre-cracked ceramic layers. In more harsh operating environments, such as those found in advanced gas turbine engines, the art exploits strain tolerant open columnar ceramic crystal or grain microstructures, such as those described in U.S. Pat. No. 4,321,311 to Strangman, the disclosure of which is herein incorporated by reference. These columnar grain microstructures have a generally parallel grain orientation and are disposed in a normal direction, perpendicular to the surface of the substrate. They are considered to provide improved strain tolerance due to the segregated nature of the columnar grains which form intercolumnar gaps therebetween.

Substantial attention also has been directed to the use of an intermediate or bond coat layer disposed between the substrate and the ceramic layer. The bond coat employs a composition designed both to enhance the chemical bond strength between the ceramic topcoat and metal substrate as well as to serve as a protective coating in the event of premature ceramic topcoat loss.

There are presently two primary classes of bond coat compositions conventionally employed in multilayered TBC systems of this type. One type of metallic bond coat typically specified by gas turbine engine designers is referred to as MCrAlY alloy, where M is iron, cobalt, nickel, or mixtures thereof The other major constituents, namely chromium, aluminum and yttrium, are represented by their elemental symbols. As used herein, the chemical symbol "Y" signifies the use of yttrium as well as other related reactive elements such as zirconium, lanthanum, and mixtures thereof A conventional MCrAlY bond coat is described in U.S. Pat. No. 4,585,481 to Gupta et al., the disclosure of which is herein incorporated by reference. In coating a superalloy substrate, the MCrAlY bond coat first is applied to the substrate by a method such as physical vapor deposition ("PVD") or low pressure plasma spraying.

The MCrAlY class of alloys are characteristically very resistant to oxidation at the elevated temperatures experienced by hot section components due to their ability to form a thin adherent protective external film of aluminum oxide or alumina. As used herein, the term "alumina" signifies predominantly aluminum oxide which may be altered by the presence of reactive elements to contain, for example, yttrium oxide or zirconium oxide. In addition to providing protection, the alumina film also provides a chemically compatible surface on which to grow the insulative ceramic topcoat. As known by those having skill in the art, the ceramic topcoat most commonly employed is zirconium oxide or zirconia, either partially or fully stabilized through the addition of oxides of yttrium, magnesium, or calcium. Conventional open columnar structured stabilized zirconia is grown on the alumina film by PVD in which the component to be coated is rotated at a constant rate in a ceramic vapor in a vacuum chamber. This coating system generally is considered to exhibit improved integrity under cyclic thermal conditions over ceramic coatings disposed directly on the metallic substrate, thereby providing the intended insulative protection to the underlying article over an extended period.

Another type of metallic bond coat routinely specified by those skilled in the art includes a class of materials known as aluminides. These are popular compositions for gas turbine engine components and include nickel, cobalt, and iron modified aluminides as well as platinum modified aluminides. Generally, aluminides are intermediate phases or intermetallic compounds with physical, chemical, and mechanical properties substantially different from the more conventional MCrAlY bond coats. Some aluminide compositions are known to be useful coatings in and of themselves for protecting iron-, cobalt-, and nickel-base alloys from oxidation and corrosion; however, some aluminides may be used as bond coats for ceramic topcoats in TBC systems.

The aluminide-based TBC system is similar to the MCrAlY-based TBC system insofar as the aluminide bond coat is first formed on the substrate surface by conventional diffusion processes such as pack cementation as described by Duderstadt et al. in U.S. Pat. No. 5,238,752 and Strangman in published U.K. Patent Application GB 2,285,632A, the disclosures of which are herein incorporated by reference. According to this method, aluminum from an aluminum halide gas in the pack mixture reacts and interdiffuses with the substrate surface over time at elevated temperature. Strangman discusses production of aluminide bond coats, for example, by reacting a nickel-, iron-, or cobalt-base superalloy article substrate with an aluminum rich vapor at elevated temperature. Strangman refers exclusively to the term "diffusion aluminide" as characteristic of the resultant bond coat. This characterization accurately corresponds to the method of aluminide bond coat production, namely by diffusion. As a result of the diffusion method, the aluminide bond coat contains nickel, iron, or cobalt from the substrate of the component being coated, depending on the primary constituent of the superalloy substrate. Further, many of the base alloying elements of the substrate are also contained in the reaction product aluminide forming on the article surface. The aluminide coated article has a surface composition which readily forms a protective alumina film when oxidized. A columnar ceramic topcoat of conventional composition and structure, as described hereinabove, completes the TBC system.

A new metallic bond coat has recently been developed which is contemplated to overcome inherent limitations of conventional MCrAlY and aluminide bond coats. An MAlY bond coat, where M is nickel, cobalt, iron, or combinations thereof and Y is yttrium or other reactive element, is disclosed in U.S. patent application Ser. No. 08/597,841, the disclosure of which is herein incorporated by reference. The reactive elements include zirconium, hafnium, scandium, or any of the lanthanides (i.e. atomic number 57–71, inclusive), either alone or in mixtures thereof. A TBC system incorporating an MAlY bond coat, alumina layer, and columnar ceramic topcoat disposed on a nickel- or cobalt-base superalloy article, is considered to be less prone to degradation and failure than TBC systems utilizing the conventional bond coats discussed above. The bond strength or adherence between the MAlY bond coat and alumina film is enhanced over conventional aluminide and MCrAlY bond coats by controlling the weight percent of the constituents. Further, by specifically excluding chromium from the bond coat, diffusional stability of the chromium-free MAlY bond coat is significantly improved over conventional MCrAlY bond coats. As a result, the MAlY bond coat provides a substantial reduction in diffusion of substrate alloy constituents through the MAlY bond coat, and maintenance of a strong MAlY/alumina bond resistant to degradation as a function of time at elevated temperature, with a concomitant enhancement in ceramic topcoat integrity. Yet further, the MAlY/alumina bond is stronger than that of a conventional modified aluminide/alumina bond. In addition, the growth rate of the alumina film is reduced by the presence of yttrium or other reactive element and the combined effect exhibits improvement over conventional aluminide-based TBC systems.

An alternative chromium-free bond coat including a noble metal constituent is disclosed in U.S. patent application Ser. No. 09/174,864, the disclosure of which is herein incorporated by reference. The noble metal bond coat includes aluminum, noble metal, yttrium or other reactive element such as zirconium, hafnium, scandium, or any of the lanthanides (i.e. atomic number 57–71, inclusive) either alone or in mixtures thereof, and balance selected from nickel, cobalt and iron, either alone or in mixtures thereof. As used herein the term "noble metal" refers to inactive or inert, corrosion resistant elements, namely ruthenium, rhodium, palladium, silver, osmium, iridium, platinum, gold, and mixtures thereof.

While conventional columnar ceramic topcoats have proven beneficial in use, they exhibit certain characteristics which inherently limit their operational performance and life regardless of the bond coat composition. For example, since conventional columnar ceramic topcoats have a grain orientation direction which extends generally perpendicularly from the underlying substrate, the grains are relatively inelastic in the normal direction and exhibit poor impact strength, resulting in chipping when contacted by high speed sand grains and other foreign particulate matter ingested or released upstream during engine operation. Erosion of the ceramic topcoat can also be a problem due to the cantilevered orientation of the columnar grains which are bonded to the alumina layer over a small surface area relative to their volume. Accordingly, the normal columnar ceramic grains are weak in a tangential or parallel direction to the substrate, resulting in brittle spalling failure of the ceramic topcoat. The underlying alumina layer, bond coat, and metallic substrate are also subject to environmental attack since the intercolumnar gaps or interstices between adjacent columnar grains afford numerous open paths for penetration of corrosive salts and other detrimental constituents of the combustion effluent. Conventional columnar ceramic topcoats also add weight to the components, which can be problematic especially for high speed rotating components such as turbine blades where overall weight and balance are critical parameters.

Service lives of the coated articles are limited by the integrity of the TBC. Any substantial chipping, spalling, erosion, or delamination of the ceramic topcoat is cause for concern. The consequences of TBC system failure are tangible and costly. Firstly, thermal operating margin must be factored into the design of the gas turbine engine to preclude over temperature and failure of hot section components with degraded TBC. By limiting combustion parameters to less than stoichiometric, the realizable efficiency of the engine is reduced with increase in fuel consumption as well as levels of unburnt hydrocarbons and other pollutants. Further, baseline engine operating parameters are premised on the existence of uniform ceramic topcoats, and ceramic topcoat life is often significantly less than underlying component life. This means engines must be removed from service for maintenance at predetermined intervals, based, for example, on operating hours or thermal cycles. Combustor, turbine, and exhaust modules are disassembled and the coated articles removed, stripped, inspected, and recoated. Significant costs are attributable to aircraft and engine unavailability. Further, substantial direct costs are associated with labor, tooling, and materials required to remove, recoat, and reinstall the affected articles. Yet further, unscheduled engine removals are forced whenever borescope inspection of the internal configuration of the engine reveals TBC system degradation beyond predetermined field service limits, further disrupting operations and increasing support costs.

SUMMARY OF THE INVENTION

A thermal barrier coating for superalloy articles includes a ceramic topcoat having at least a first ceramic layer exhibiting a generally columnar grain microstructure with a first grain orientation and a second ceramic layer disposed thereon having a generally columnar grain microstructure with a different grain orientation direction. Additional ceramic layers may be provided with respective grain orientation directions as desired. Alternating layers may have grain orientation directions which are substantially similar, generating a cross-sectional grain microstructure visually replicating a herringbone or zigzag pattern. This pattern consists of layers of columnar grains which are generally parallel to adjacent grains within a single layer and which form an angle with columnar grains in a proximal layer. The angle of each layer relative to an underlying substrate surface may range from values approaching zero degrees to those approaching 180 degrees. The multilayered ceramic coating may be disposed directly on the superalloy substrate, or alternatively, may form a topcoat of a TBC system incorporating an alumina layer and a bond coat of MAlY, MCrAlY, aluminide, or other composition.

The multilayered ceramic coating is formed advantageously by electron beam physical vapor deposition ("EB-PVD") in which the article to be coated is disposed in an EB-PVD chamber at a first orientation relative to a ceramic target of the desired composition. Exemplary ceramic compositions include zirconia and zirconia stabilized with yttria, ceria, calcia, scandium oxide, lanthanum oxide, or mixtures thereof As the electron beam vaporizes the target, a first ceramic layer is deposited on the surface of the article exposed to the vapor source. The resultant columnar grain microstructure of the first layer exhibits a grain orientation direction related to initial article orientation. Thereafter, the article is moved to a second orientation relative to the ceramic vapor source and a second ceramic layer is deposited on the first layer. Since the orientation of the article relative to the source has changed, the resultant columnar grain microstructure of the second ceramic layer exhibits a grain orientation direction related thereto which is different that the grain orientation direction of the first layer. Additional layers can be added employing the same methodology.

Changes in article orientation can be achieved by rotation, translation, or combinations thereof along one or more orthogonal or skew axes. Additionally, the article need not necessarily dwell motionless during the deposition of a ceramic layer, but could be in motion. For example, to coat a complex contoured surface such as a turbine blade airfoil, the blade may be rotated in the vapor cloud.

By varying the orientation of the article relative to the source, the angle of the grain orientation direction for the ceramic layer produced can be varied. Additionally, by varying the time the article is maintained at a given orientation during coating deposition, the thickness of the ceramic layer and lengths of the grains therein can be varied. Accordingly, the method of the invention can be used to deposit a highly regular, substantially uniform herringbone cross-sectional pattern by alternating between first and second article orientations and dwelling or rotating for equivalent periods at each orientation. Alternatively, non-uniform patterns can be produced to achieve tailored properties which vary as a function of ceramic coating thickness or depth. In alternative embodiments, one or more ceramic layers having angled grain orientation directions can be used in combination with one or more ceramic layers having a normal grain orientation direction.

Moreover, by continuously changing the reorientation speed of the article according to a predetermined speed cycle, more arcuate or rounded columnar grains can be formed, for example replicating a substantially sinusoidal waveform. Further, by adding a second reorientation axis, for example, in a plane perpendicular to that of the first reorientation axis, more complex columnar grains can be produced, such as helical grains and grains having certain three dimensional features such as twist.

An exemplary application for the layered ceramic TBC includes use on nickel- and cobalt-base superalloy articles such as hot section components of gas turbine engines. The superalloy substrate may be coated with a bond coat having an affinity for the substrate utilizing any of a variety of processes such as EB-PVD, gas phase or pack cementation aluminizing, simple physical or chemical vapor deposition of reactive elements on the surface of a conventional aluminide coating, ion PVD or sputtering using a prealloyed cathode of the desired composition, and vacuum or low pressure plasma spraying of prealloyed powder. Depending on the process, the coated article may be subjected subsequently to a thermal processing cycle to metallurgically bond the bond coat to the article substrate. An intermediate layer of alumina is formed on the bond coat by conventional processes and the multilayered ceramic topcoat is applied overall. Alternatively, the multilayered ceramic topcoat may be formed directly on a superalloy or other substrate.

BRIEF DESCRIPTION OF THE DRAWINGS

The invention, in accordance with preferred and exemplary embodiments, together with further advantages thereof, is more particularly described in the following detailed description taken in conjunction with the accompanying drawings in which:

FIG. 7 is a graph plotting article reorientation angle as a function of time for producing a regular herringbone-type columnar ceramic structure and for producing an arcuate sinusoidal-type columnar ceramic structure;

FIG. 8 is an enlarged schematic, cross-sectional view of a portion of a ceramic topcoat of a TBC system in accordance with another alternative embodiment of the present invention; and FIG. 9 is an enlarged schematic, cross-sectional view of a portion of a ceramic topcoat of a TBC system in accordance with still another alternative embodiment of the present invention.

MODE(S) FOR CARRYING OUT THE INVENTION

Figure 1:
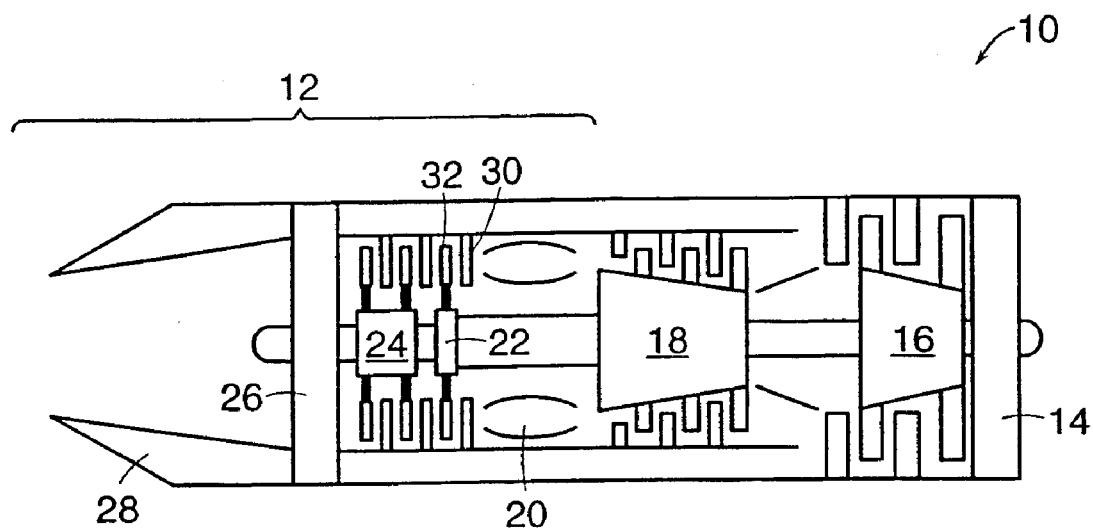
FIG. 1 is a schematic, cross-sectional view of a typical gas turbine engine depicting hot section components suitable for application of a TBC system in accordance with an embodiment of the present invention.

Depicted in FIG. 1 is a schematic, cross-sectional view of a typical turbofan gas turbine engine 10 depicting hot section components, shown generally at 12, suitable for application of a multilayered ceramic topcoat TBC system in accordance with an exemplary embodiment of the present invention. As depicted, the engine 10 includes, in serial flow relation from inlet to exhaust, a inlet frame 14, a two stage low pressure compressor ("LPC") or fan 16, a three stage high pressure compressor ("HPC") 18, a combustor 20, a single stage high pressure turbine ("HPT") 22, a two stage low pressure turbine ("LPT") 24, a turbine frame 26, and an exhaust nozzle 28.

Compressed air exiting the HPC 18 is mixed with fuel in the combustor 20 and ignited. The high temperature, high energy combustion effluent passes through both the HPT 22 and LPT 24 where energy is extracted to drive the HPC 18 and fan 16. Each turbine stage, for example HPT 22, includes a set of stationary turbine vanes 30 and rotating turbine blades 32 disposed in the effluent stream to optimize flow orientation and energy extraction. After passing through the turbine frame 24, which supports the rotating components of the engine 10, the effluent is mixed with the fan flow and passes through the exhaust nozzle 28, producing a net force or thrust which propels the engine 10 forward.

Hot section components 12 exposed to the high temperature, corrosive combustion effluent may be coated with the multilayered ceramic topcoat TBC system, in accordance with the teachings of this invention, to protect the superalloy substrate from excessive temperature as well as from oxidation during engine operation.

Figure 2:
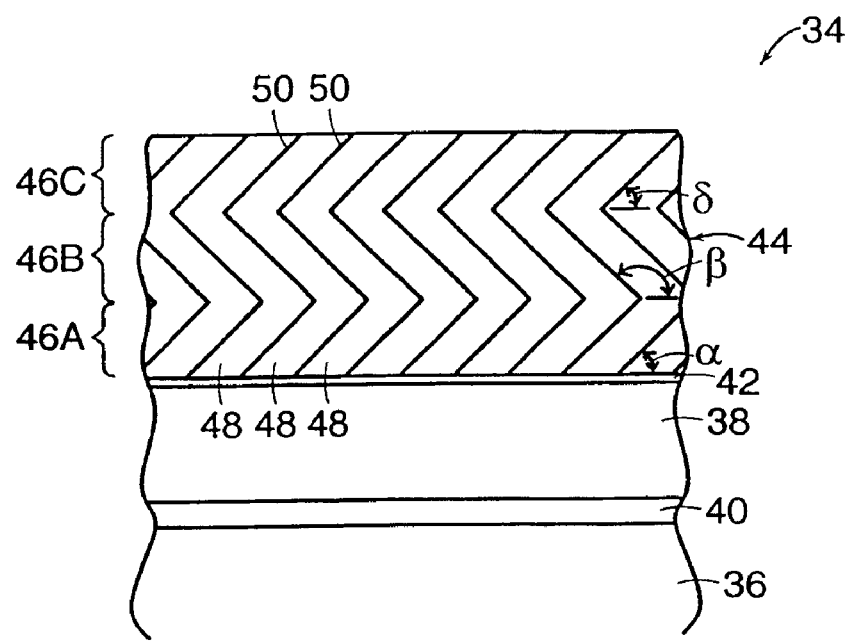
FIG. 2 is an enlarged schematic, cross-sectional view of a portion of a superalloy article coated with a TBC system in accordance with an embodiment of the present invention.

Referring now to FIG. 2, depicted is an enlarged schematic, cross-sectional view of a portion of a superalloy article 34, such as an airfoil wall of a turbine blade 32, coated with the multilayered ceramic topcoat TBC system in accordance with an exemplary embodiment of the present invention. Schematic representation and relative thickness of each layer of the TBC system depicted in FIG. 2 are meant for illustrative purposes only and in no manner are intended to restrict the scope of the invention.

The article 34 in FIG. 2 includes a substrate 36, a portion of which is depicted. The substrate 36 is preferably composed of a nickel- or cobalt-base superalloy; however, it is contemplated that the multilayered ceramic topcoat of the present invention may be suitable for use with any superalloy, metallic substrate, alumina layer, or bond coat with which it may form an adequate bond. For purposes herein, adequate bond may be characterized as adherence equal or superior to that between any other layers in the TBC system or between any layers in the multilayered ceramic coating.

An aluminide, MAlY, or MCrAlY bond coat 38 having a desired composition may be produced on the substrate 36. In an exemplary embodiment, an MAlY bond coat 38 has a composition of about 13 to 30 weight percent aluminum, between trace and about 3 weight percent of a reactive element such as yttrium, zirconium, lanthanum, or scandium, or mixtures thereof, and balance being nickel, cobalt, iron or mixtures thereof In a preferred composition, bond coat 38 includes about 20 to 22 weight percent aluminum, about 0.25 to 0.4 weight percent yttrium, and balance nickel. In both instances, chromium is purposely omitted from the bond coat 38, although some inconsequential, inadvertent trace amount might conceivably exist therein. The bond coat 38 is preferably produced by means of low pressure or vacuum plasma spray using a prealloyed powder, rather than conventional diffusion methods such as pack cementation. An exemplary plasma spray method is disclosed, for example, in U.S. Pat. No. Re. 33,876 to Goward et al., the disclosure of which is incorporated herein by reference. By using a plasma spray method, the composition of the bond coat 38 may be controlled better and the migration of base alloy elements from the substrate 36, which might otherwise pose a detriment to bond coat/alumina adherence, may be reduced markedly. A relatively thin diffusion zone 40 inherently forms between the bond coat 38 and substrate 36 supporting the bond therebetween.

Due to the highly reactive nature of the MAlY bond coat 38 during production of the TBC system, aluminum proximate the exposed outer surface of the bond coat 38 oxidizes substantially instantaneously upon exposure to any oxygen or moisture containing environment at elevated temperature, resulting in a thin layer of aluminum oxide or alumina 42. Such an oxidized layer may also be referred to as an alumina film or scale. Lastly, a multilayered ceramic topcoat 44 is disposed on the alumina film 42 to achieve the desired insulative properties of the TBC system. The columnar ceramic topcoat 44 preferably is produced by EB-PVD, although other techniques consistent with the production of columnar microstructure may be used as desired. An exemplary PVD method and apparatus for producing conventional, normally disposed grains is disclosed in U.S. Pat. No. 4,880,614 to Strangman et al., the disclosure of which is incorporated herein by reference. As will be discussed in greater detail herein below with respect to FIGS. 4A and 4B, careful manipulation of the article in a predetermined manner during coating is employed to achieve the desired multilayered, angled ceramic grain orientation directions.

The ceramic topcoat 44 includes a first layer 46A which exhibits a generally columnar grain microstructure having the grains 48 ordered regularly in a first grain orientation direction. Each grain 48 forms an included acute angle, α, with a line generally parallel to or tangential with the surface of the substrate 36. The open columnar grains 48 form interstices or intercolumnar gaps 50 therebetween which afford desirable strain tolerance as the topcoat 44 expands and contracts a different amount than the underlying bond coat 38 and substrate 36 for a given temperature change. The gaps 50 may extend down to the alumina layer 42 or may terminate a small distance therefrom. Alternatively, the gaps 50 may be substantially closed, merely designating grain boundaries.

The ceramic topcoat 44 includes a second layer 46B in intimate contact with the first layer 46A. The second layer 46B includes a plurality of open columnar grains which may be extensions of the grains 48 of the first layer 44A so that the intercolumnar gaps 50 of the first layer 46A extend through the second layer 46B as well. As may be readily appreciated from the depiction, the second layer 46B exhibits a generally columnar grain microstructure having the grains ordered regularly in a second grain orientation direction different than the first grain orientation direction. Each grain forms an included obtuse angle, β, with a line generally parallel to or tangential with the surface of the substrate 36, the angle β being measured in the same direction as the angle α.

The ceramic topcoat 44 includes a third outermost layer 46C in intimate contact with the second layer 46B. The third layer 46C includes a plurality of open columnar grains which may be extensions of the grains of the second layer 44B so that the intercolumnar gaps of the second layer 46B extend through the third layer 46C as well. As may be readily appreciated from the depiction, the third layer 46C exhibits a generally columnar grain nicrostructure having the grains ordered regularly in a third grain orientation direction different than the second grain orientation direction. Each grain forms an included acute angle, δ, with a line generally parallel to or tangential with the surface of the substrate 36, the angle δ being measured in the same direction as the angles α and β.

For the ceramic topcoat 44 depicted in FIG. 2, the thickness of each layer or, alternatively, the length of each grain in the layers is substantially similar. Further, the grain orientation direction of each layer is substantially similar, although reversed for each subsequent layer. The resultant topcoat 44 depicted in FIG. 2 exhibits a highly regular, columnar grain microstructure reminiscent of a herringbone or zigzag pattern. The grains 48 are depicted having respective included angles α, β, and δ within each of layers 46A, 46B, and 46C equal to about 45 degrees, 135 degrees, and 45 degrees, respectively. As will be discussed in greater detail hereinbelow, the grain orientation direction and accordingly the included angle of the grains within a given layer results from the orientation of the substrate 36 relative to the source of ceramic vapor during the PVD process. The angle may be varied from near zero degrees to near 180 degrees, as desired. Fewer or greater number of layers may be provided, each with the same or different thickness and with the same or different grain orientation direction.

While a highly regular or symmetrical ceramic topcoat pattern such as that depicted in FIG. 2 may be desirable for certain applications, alternative embodiments are contemplated which may afford improved properties for specific applications which entail directional mechanical loading of the coated article. Referring now to FIGS. 3A–3D, depicted therein are enlarged schematic, cross-sectional views of a portion of four ceramic topcoats of a TBC system in accordance with alternative embodiments of the present invention. These topcoats may be used alone, in combination with any other topcoat microstructure depicted herein, including any portions thereof, as well as with equivalents and variants.

Figure 3A:
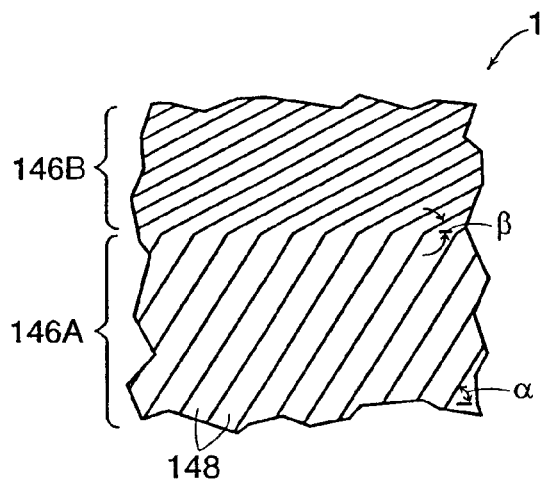
FIG. 3A is an enlarged schematic, cross-sectional view of a portion of a ceramic topcoat of a TBC system in accordance with an alternative embodiment of the present invention.

Looking first to FIG. 3A, a ceramic topcoat 144 includes at least a first layer 146A which exhibits a generally columnar grain microstructure having the grains 148 ordered regularly in a first grain orientation direction. Each grain 148 forms an included acute angle, α, with a line generally parallel to or tangential with the surface of an underlying substrate. The ceramic topcoat 144 includes a second layer 146B in intimate contact with the first layer 146A. The second layer 146B exhibits a generally columnar grain microstructure having the grains ordered regularly in a second grain orientation direction different than the first grain orientation direction. Each grain forms an included acute angle, β, with a line generally parallel to or tangential with the surface of an underlying substrate. The acute angle β is measured in the same direction as the angle α and is less than the value of angle α. As depicted, angle α has a value of about 60 degrees and angle β has an angle of about 30 degrees. One or more additional layers may be disposed proximate the first layer 146A and/or the second layer 146B with similar or different grain orientation directions and thicknesses. For example, a third layer could be disposed proximate the second layer 146 and have a grain orientation direction forming an acute angle or an obtuse angle with the surface of an underlying substrate.

Figure 3B:
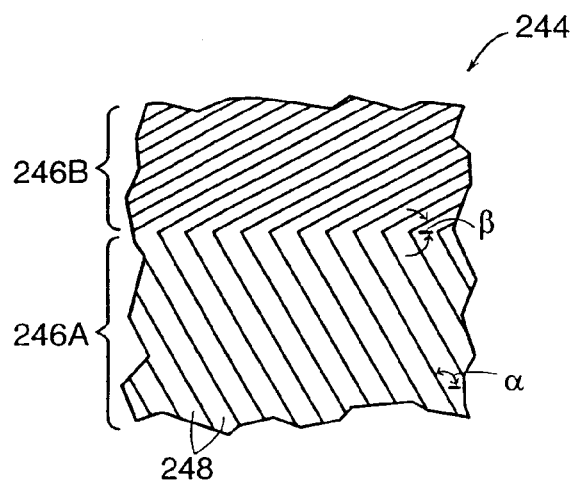
FIG. 3B is an enlarged schematic, cross-sectional view of a portion of a ceramic topcoat of a TBC system in accordance with another embodiment of the present invention.

FIG. 3B depicts a ceramic topcoat 244 including at least a first layer 246A which exhibits a generally columnar grain microstructure having the grains 248 ordered regularly in a first grain orientation direction. Each grain 248 forms an included obtuse angle, a, with a line generally parallel to or tangential with the surface of an underlying substrate. The ceramic topcoat 244 includes a second layer 246B in intimate contact with the first layer 246A. The second layer 246B exhibits a generally columnar grain microstructure having the grains ordered regularly in a second grain orientation direction different than the first grain orientation direction. Each grain forms an included acute angle, β, with a line generally parallel to or tangential with the surface of an underlying substrate. The acute angle β is measured in the same direction as the angle α. As depicted, angle α has a value of about 120 degrees and angle β has an angle of about 30 degrees. One or more additional layers may be disposed proximate the first layer 246A and/or the second layer 246B with similar or different grain orientation directions and thicknesses.

Figure 3C:
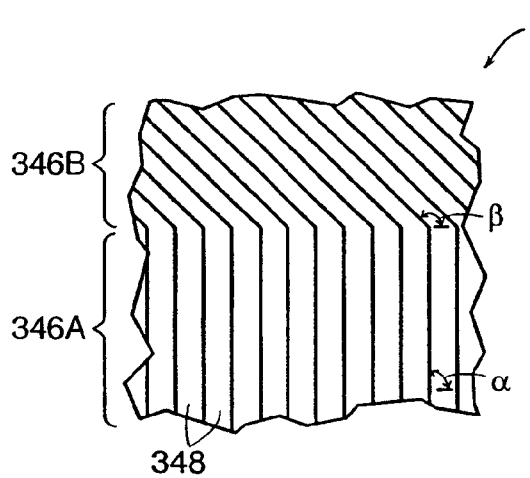
FIG. 3C is an enlarged schematic, cross-sectional view of a portion of a ceramic topcoat of a TBC system in accordance with yet another embodiment of the present invention.

A ceramic topcoat 344 depicted in FIG. 3C includes a first layer 346A which exhibits a generally columnar grain microstructure having the grains 348 ordered regularly in a first grain orientation direction. Each grain 348 forms a substantially normal included angle, α, with a line generally parallel to or tangential with the surface of an underlying substrate. The ceramic topcoat 344 includes a second layer 346B in intimate contact with the first layer 346A. The second layer 346B exhibits a generally columnar grain microstructure having the grains ordered regularly in a second grain orientation direction different than the first grain orientation direction. Each grain forms an included obtuse angle, β, with a line generally parallel to or tangential with the surface of an underlying substrate. The obtuse angle β is measured in the same direction as the angle α. As depicted, angle α has a value of about 90 degrees and angle β has an angle of about 135 degrees. One or more additional layers may be disposed proximate the first layer 346A and/or the second layer 346B with similar or different grain orientation directions and thicknesses. Alternatively, the first layer 346A exhibiting the normal grain orientation direction may be an innermost layer of a multilayered ceramic topcoat, being disposed directly on a substrate or on an interdisposed bond coat and alumina layer.

Figure 3D:
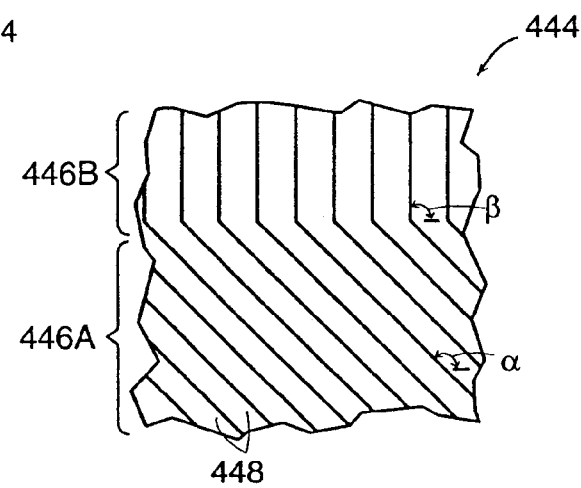
FIG. 3D is an enlarged schematic, cross-sectional view of a portion of a ceramic topcoat of a TBC system in accordance with still another embodiment of the present invention.

Lastly, FIG. 3D depicts a ceramic topcoat 444 which includes a first layer 446A which exhibits a generally columnar grain microstructure having the grains 448 ordered regularly in a first grain orientation direction. Each grain 448 forms an included obtuse angle, α, with a line generally parallel to or tangential with the surface of an underlying substrate. The ceramic topcoat 444 includes a second layer 446B in intimate contact with the first layer 446A. The second layer 446B exhibits a generally columnar grain microstructure having the grains ordered regularly in a second grain orientation direction different than the first grain orientation direction. Each grain forms a substantially normal included angle, β, with a line generally parallel to or tangential with the surface of an underlying substrate. The normal angle β is measured in the same direction as the angle α. As depicted, angle α has a value of about 135 degrees and angle β has an angle of about 90 degrees. One or more additional layers may be disposed proximate the first layer 446A and/or the second layer 446B with similar or different grain orientation directions and thicknesses. Alternatively, the second layer 446B exhibiting the normal grain orientation direction may be an outermost layer of a multilayered ceramic topcoat, being disposed remotely from a substrate and exposed directly to the combustion effluent and other environmental gases and associated matter.

Figure 4A:
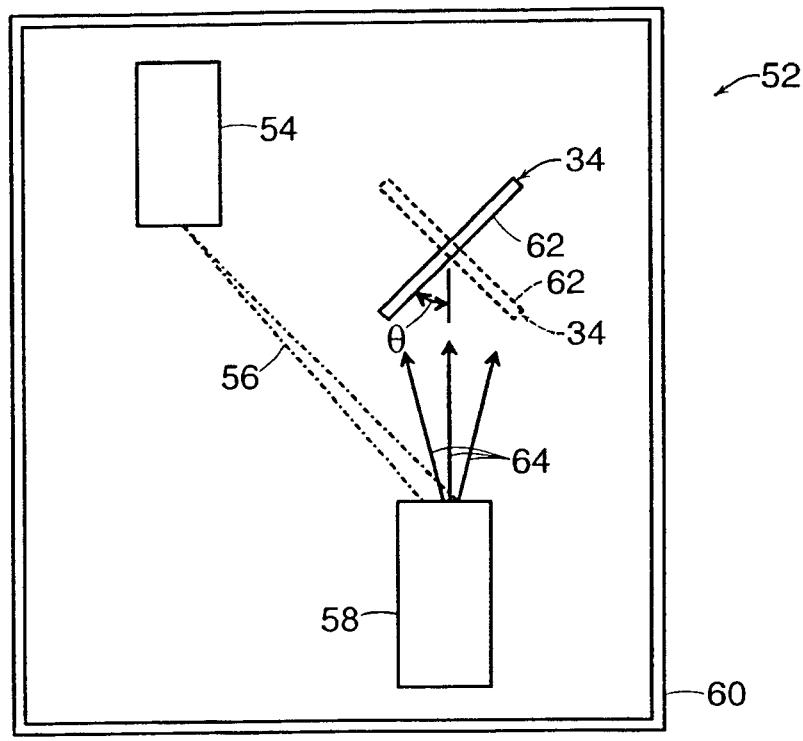
FIG. 4A is a schematic, cross-sectional view of a portion of an EB-PVD apparatus for producing a TBC in accordance with an embodiment of the present invention.

An exemplary EB-PVD apparatus 52 for producing the multilayered ceramic topcoats discussed hereinabove is depicted in FIG. 4A. Reference may be made also to U.S. Pat. No. 4,880,614 to Strangman et al. and U.S. Pat. No. 5,238,752 to Duderstadt et al. for descriptions of general configurations of conventional EB-PVD apparatus, the disclosures of which are herein incorporated by reference. According to FIG. 4A, the EB-PVD apparatus 52 includes a vacuum chamber 60 in which is disposed an electron beam gun 54 for generating a high energy electron beam 56. The beam 56 is directed by magnetic fields or other deflection apparatus (not depicted) to impinge an upper surface of a target 58 consisting of a ceramic ingot of the desired topcoat composition, for example, zirconia. The target material is vaporized, producing a vapor cloud having a direction, shown generally at 64, which impinges on a proximally facing surface 62 of the article 34 to be coated. The article 34 is mounted on a movable support (not depicted) and may include a bond coat 38 and alumina layer 42 disposed on the substrate 36 thereof as depicted in FIG. 2. Upon impinging the surface 62, the ceramic vapor condenses forming a columnar grain microstructure.

By orienting the article 34 at an angle, θ, relative to the general vapor cloud direction 64, the resulting columnar grains exhibit a grain orientation direction corresponding to the angle, α, depicted in FIG. 2. Accordingly, by providing the article 34 at close to a 45 degree orientation relative to the vapor cloud direction 64 depicted in FIG. 4A, the first ceramic layer 46A depicted in FIG. 2 and having a grain orientation direction of about 45 degrees is produced. The article 34 may be maintained in this orientation for a time sufficient to grow the first ceramic layer 46A to the desired thickness. The article 34 is then moved to a second, different orientation relative to the vapor cloud direction 64, for example, by rotating the article 34 clockwise as depicted in broken line format in FIG. 4A. The article 34 is dwelled at this orientation for a time sufficient to grow the second ceramic layer 46B to the desired thickness. For this article orientation, where θ is close to 135 degrees, a resulting grain orientation direction of about 135 degrees is produced, correlating to that of second ceramic layer 46B of FIG. 2. To deposit the third layer 46C and complete the regular ceramic topcoat 44 depicted in FIG. 2, the article 34 is returned to the first orientation where θ is close to 45 degrees, either by completing rotation of the article 34 in the clockwise direction or reversing rotation, as desired. The article 34 is dwelled at this orientation for a time to grow the third ceramic layer 46C to the desired thickness. For this article orientation, a resulting grain orientation direction of about 45 degrees is produced, correlating to that of third ceramic layer 46C of FIG. 2. A more detailed discussion of an empirically determined correlation between article orientation angle, θ, and grain orientation direction angle, α, is presented hereinbelow with respect to FIG. 5A.

Any of a variety of article position systems (not depicted) may be employed to position the article 34 to be coated at the desired orientations relative to the ceramic vapor cloud direction 64. An exemplary system may include a shaft on which the article 34 is mounted, the shaft being connect to an electric stepper motor, hydraulic servomechanism, or equivalent primary mover. A positional feedback loop may be provided to ensure accurate positioning of the article 34. Additionally, a programmable controller (not depicted) may be used advantageously to automate the timing of the movement and dwell steps of the coating method to facilitate consistent, reproducible results. Alternatively, a manual crank with angular limits may be provided as a low cost alternative. For the EB-PVD apparatus 52 depicted in FIG. 4A, the article positioning system could be a rotatable shaft having an axis of rotation passing normally through the plane of the figure. The article 34 dwells motionless at the first orientation to produce the first ceramic layer, is moved to and dwells motionless at the second orientation to produce the second ceramic layer, and so on. Alternatively, depending on ceramic deposition rate and desired layer thicknesses, the article need not dwell absolutely motionless during coating deposition, but rather can continue in motion, albeit at a substantially reduced rate relative to the rate of motion during reorientation. In yet another embodiment, the article may be repeatedly moved back and forth between first and second positions without dwelling to generate incrementally thin ceramic layers of alternating grain orientation.

While a simple rotational position system may be sufficient to reorient planar and geometrically similar articles 34 to be coated with the multilayered ceramic topcoat as depicted in FIG. 4A, more complex contoured geometries may require positioning systems with additional degrees of freedom including, for example, multiple orthogonal or skew axes along which rotation and/or translation can be effected. Such systems are commercially available and can be readily integrated into an EB-PVD apparatus. For example, referring to FIG. 4B, another exemplary EB-PVD apparatus 152 for producing the multilayered ceramic topcoats discussed hereinabove is depicted. The EB-PVD apparatus 152 includes a vacuum chamber 160, an electron beam gun 154 for generating a high energy electron beam 156, and a target 158 consisting of a ceramic ingot of the desired topcoat composition. The target material is vaporized, producing a vapor cloud having a direction, shown generally at 164, which impinges on a proximally facing surface 162 of the article 134 to be coated. Upon impinging the surface 162, the ceramic vapor condenses forming a columnar grain microstructure.

To prevent accumulation of the ceramic condensate solely on surface 162, the contoured article 134 to be coated, such as an airfoil of turbine blade 32, may be rotated about an axis of rotation, X, thereof which is oriented at an angle, $\theta$, relative to the general vapor cloud direction 164. The resulting columnar grains exhibit a grain orientation direction generally corresponding to the angle $\theta$ relative to the article substrate locally. The article 134 is rotated with the axis X at the first orientation for a time sufficient to grow a first ceramic layer to the desired thickness. The article 134 is then moved to a second, different orientation relative to the vapor cloud direction 164, for example, by reorienting axis X counterclockwise as depicted in broken line format in FIG. 4B. The article 134 is rotated about axis X with the axis X dwelled at this orientation for a time sufficient to grow the second ceramic layer to the desired thickness. The resulting columnar grains in the second layer exhibit a grain orientation direction correlating generally to the reoriented angle of the article. Subsequent layers with different or alternating grain orientation directions can be produced by reorienting the axis X as desired. By maintaining rotation of the article 143 about axis X, a multilayered coating of substantially uniform thickness can be achieved. To prevent condensation of coating on precision mating surfaces such as platform edges and dovetails, the surfaces can be masked prior to mounting of the article 134 in the EB-PVD apparatus 152.

Testing has been conducted to evaluate ceramic grain orientation direction angle, $\alpha$, and ceramic layer thickness, t, as a function of article orientation angle, $\theta$, over a 90 degree quadrant. Exemplary test conditions and relevant parameters are as follows. Test samples manufactured from Hastelloy X were coated with an MCrAlY bond coat by a VPS method, shot peened, polished to a surface roughness of about 1 to 2 $\mu$m $R_a$, and cleaned. Each sample was placed in a modified EB-PVD coating apparatus and preheated to about 900° C. by an electron beam. A first columnar ceramic topcoat layer was applied by orienting the sample at a first predetermined angle, $\theta$, to an ingot having a composition of $ZrO_2$—8%$Y_2O_3$. The ingot was vaporized by an electron beam with a power of about 40 kW. The resulting ceramic vapor cloud condensed on the preheated sample while sample temperature was maintained in the range of about 800° C. to about 900° C. During the ceramic coating process, the sample was dwelled for about one minute at the first predetermined angle, then reoriented approximately ninety degrees and dwelled for about one minute in this orientation. This procedure was repeated about twenty times to produce a regular herringbone or zigzag pattern. Each sample was sectioned so that grain orientation direction angle, $\alpha$, and ceramic layer thickness, t, could be measured with the aid of a microscope.

Figure 5A:
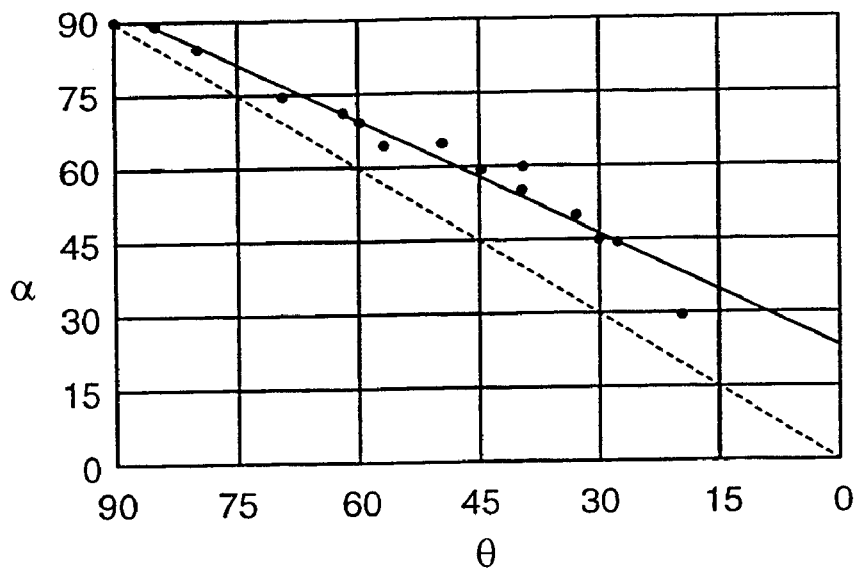
FIG. 5A is a graph plotting ceramic grain orientation direction as a function of article orientation showing, generally, that measured grain orientation direction angle, α, tends to be slightly less acute than article orientation angle, θ.
Figure 5B:
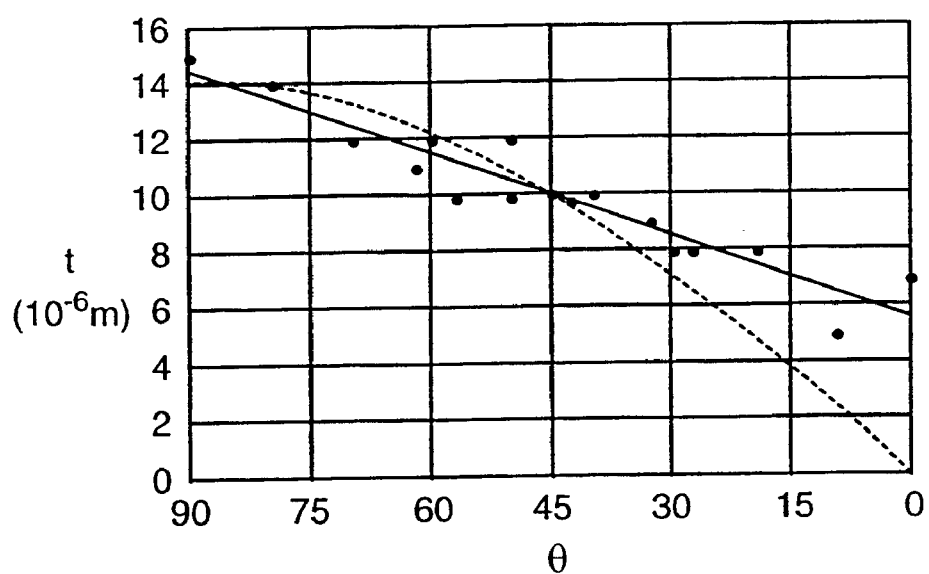
FIG. 5B is a graph plotting ceramic layer thickness, t, under constant conditions, as a function of article orientation angle, θ, showing, generally, that measured ceramic layer thickness, T, for orientation angles greater than about thirty degrees is consistent with model expectations, suggesting correlation of non-mechanical material properties between multilayered and conventional, normally disposed columnar ceramic coatings.

Empirical results are plotted, respectively, in FIGS. 5A and 5B. Referring first to FIG. 5A, measured data points are marked as dots with a statistical linear best fit line drawn as a solid line therethrough. A perfect correlation line is represented by the diagonally disposed dashed line in the plot. Note that the grain orientation direction angle, $\alpha$, tracks the article orientation angle, $\theta$, generally linearly; however, the grain orientation direction angle, $\alpha$, tends to be slightly less acute than the article orientation angle, $\theta$. For example, for an article orientation angle, $\theta$, having a value of about 30 degrees, resultant grain orientation direction angle, $\alpha$, has a measured value of about 45 degrees. For an article orientation angle, $\theta$, of about 45 degrees, resultant grain orientation direction angle, $\alpha$, has a measured value of about 60 degrees. For values of $\theta$ approaching 90 degrees, values of $\alpha$ substantially converge therewith.

FIG. 5B plots ceramic layer thickness, t, in microns as a function of article orientation angle, $\theta$. Ceramic layer thickness, t, may be measured for a first ceramic layer as the average normal distance between a proximate underlying layer of alumina, bond coat, or substrate and a change in grain orientation direction. For an internal ceramic layer, thickness t may be measured as the average normal distance between underlying and overlying changes in grain orientation direction. For an outermost ceramic layer, thickness t may be measured as the average normal distance between an underlying change in grain orientation direction and the exposed surface of the ceramic layer. These respective thicknesses correlate generally to the bracketed designations of first layer 46A, second layer 46B, and third layer 46C depicted schematically in FIG. 2.

In FIG. 5B, measured data points are marked as dots with a statistical linear best fit line drawn as a solid line therethrough. A mathematical model of the process, which assumes that the ceramic layer thickness is the product of the average deposition rate, the sine of the article orientation angle, $\theta$, and the elapsed deposition time is represented by the curved, dashed line in the plot. According to the model, for an orientation angle, $\theta$, of 90 degrees where the vapor cloud direction is substantially normal to the substrate surface, the ceramic layer thickness will be at a maximum, substantially equivalent to the product of the deposition rate and elapsed time. For an article orientation angle, $\theta$, of zero degrees where the vapor cloud direction is substantially parallel to the substrate surface, the ceramic layer thickness will be essentially zero according to the model. Empirical results show substantial correlation with the model down to article orientation angle values of about 30 degrees. For more acute angles, the deposited ceramic layer thickness, T, is greater than expected. One explanation may be that the ceramic deposited at article orientation angles less than about 30 degrees is less dense or, alternatively, more porous than the ceramic deposited at angles greater than about 30 degrees. This porosity could affect properties of the coating such as thermal conductivity. At least for article orientation angles greater than about 30 degrees, however, this data indicates that density, porosity, and most probably all non-mechanical coating properties for a given layer are at least as good as those of conventional, normally disposed columnar ceramic coatings.

Mechanical properties of the multilayered ceramic coating, however, are contemplated to be significantly improved relative to conventional, normally disposed columnar ceramic coatings. Since the multilayered ceramic topcoats include grain orientation directions which form acute included angles with the underlying substrate, the grains are relatively elastic in the normal direction and should exhibit improved impact strength, resulting in increased resistance to chipping when impacted by high speed sand grains and other foreign particulate matter ingested or released upstream during engine operation. Erosion of the multilayered ceramic topcoat should also be reduced since the angled grains are bonded to the alumina layer over a large surface area relative to their volume. Accordingly, the angled columnar ceramic grains are more robust in a tangential or parallel direction to the substrate, minimizing brittle spalling failure of the ceramic topcoat. The underlying alumina layer, bond coat, and metallic substrate are also protected from environmental attack since the intercolumnar gaps or interstices between adjacent columnar grains present a tortuous path, substantially preventing penetration of corrosive salts and other detrimental constituents of the combustion effluent. Weight of the multilayered ceramic topcoats may also be significantly less than conventional columnar ceramic coatings for the same thermal protection, since the multilayered topcoat has been demonstrated to decrease thermal conductivity by over 30 percent. Accordingly, at least a 30 percent reduction in coating thickness may be realized with concomitant savings in weight and cost. Alternatively, a similar coating thickness could result in substantially improved thermal insulation.

The following examples are intended to convey illustrative aspects of the present invention and are not meant to be considered limiting of the invention in any respect.

EXAMPLE 1

Test samples of cast CMSX2 single crystal material were coated with about a 50 $\mu$m thick platinum aluminide bond coating and heat treated in a vacuum to adjust the surface concentration of aluminum to between about 20 weight percent and about 24 weight percent. Each sample was placed in a modified EB-PVD coating apparatus and preheated to about 850° C. by an electron beam. A first columnar ceramic topcoat layer was applied by orienting the sample at a first predetermined angle substantially perpendicular to an ingot having a composition of $ZrO_2$— $8\%Y_2O_3$. The sample was maintained in this orientation and rotated at a rate of about 25 rotations per minute ("rpm") for a total period of about one minute while the ingot was vaporized by an electron beam with a power of about 38 kW. The resulting ceramic vapor cloud condensed on the preheated sample producing a first columnar layer substantially perpendicular to the platinum aluminide bond coat and underlying substrate material. The sample was then alternatively reoriented to angles of about negative 45 degrees and positive 45 degrees relative to the normal orientation and rotated at a rate of about 25 rpm for one minute at each reorientation position. The process was continued until a total of fifteen layers were produced, each layer having a thickness, t, of about 10 $\mu$m producing a total ceramic topcoat thickness of about 150 $\mu$m. The innermost layer proximate the bond coat exhibited a grain orientation direction angle of about 90 degrees with subsequent layers alternating between angles of close to about 135 degrees and 45 degrees, thereby producing a regular herringbone pattern. A sectional view of the innermost and second layers visually replicates FIG. 3C and that of the second and third layers visually replicates FIG. 3B.

EXAMPLE 2

Figure 6:
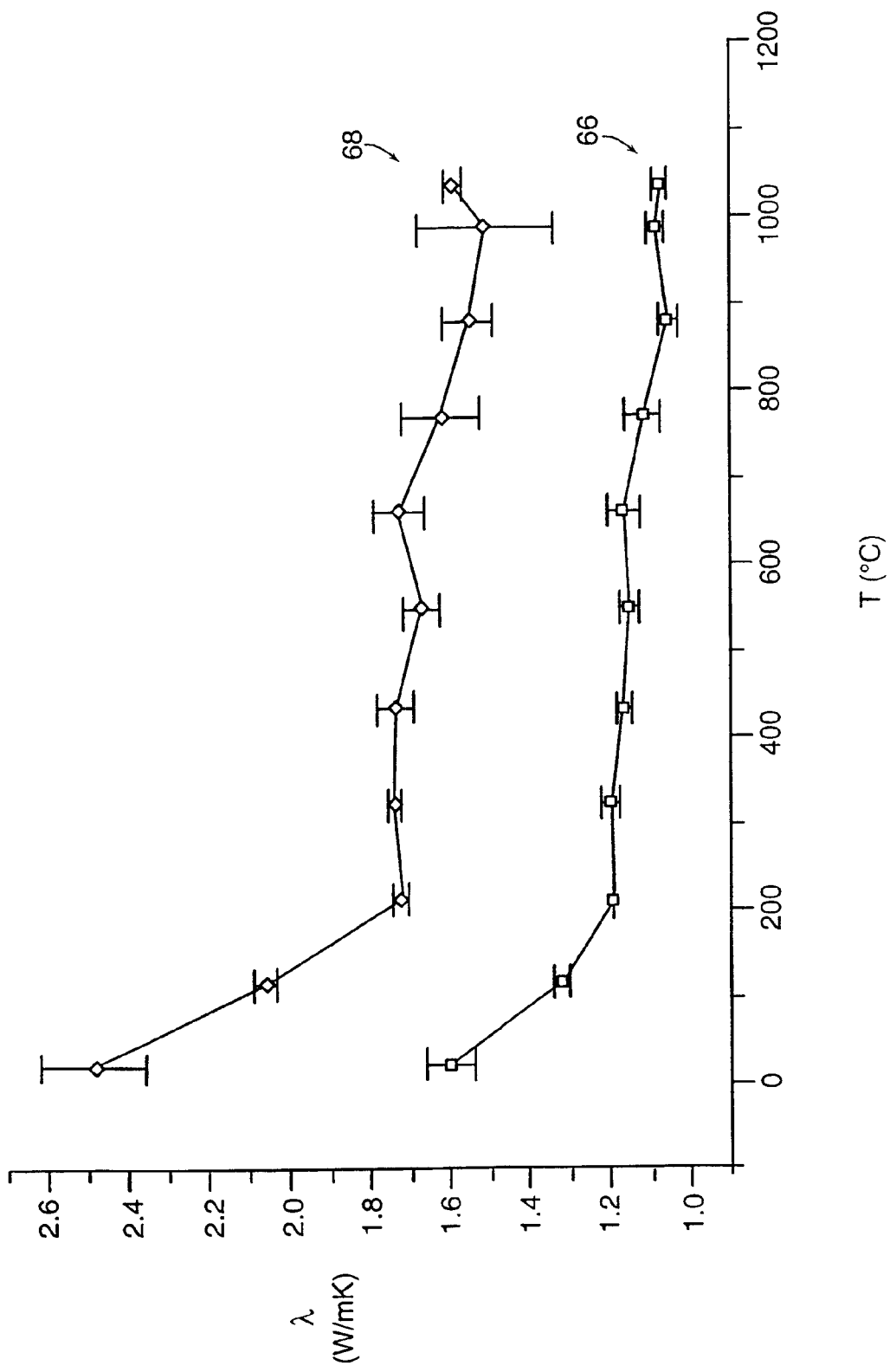
FIG. 6 is a graph plotting thermal conductivity, λ, as a function of temperature, T, showing reduced thermal conductivity of an exemplary herringbone multilayered columnar ceramic coating with respect to a conventional, normally disposed columnar ceramic coating.

Test samples of Hastelloy X with an LPPS bond coating were pre-treated by ceramic peening, vibro-polishing, and cleaning. Each sample was placed in a modified EB-PVD coating apparatus and preheated to about 850° C. by an electron beam. A first columnar ceramic topcoat layer was applied by orienting the sample at a first predetermined angle of about negative 45 degrees relative to an orientation normal to an ingot. The sample was maintained in this orientation for a total period of about one minute while the ingot having a composition of $ZrO_2$— $8\%Y_2O_3$ was vaporized by an electron beam with a power of about 38 kW. The resulting ceramic vapor cloud condensed on the preheated sample producing a first columnar layer having a grain orientation direction angle of close to about 135 degrees relative to the bond coating and underlying substrate. The sample was then alternatively reoriented to angles of about positive 45 degrees and back to negative 45 degrees relative to the normal orientation and dwelled for one minute at each reorientation position. In this manner, a herringbone structure comparable to layers two through fifteen of Example 1 was created. With laser flash measurements, the thermal conductivity, $\lambda$, of this ceramic topcoat in units of W/mK was measured in the temperature range of near 0° C. to about 1100° C. The data is presented in the graph in FIG. 6 as curve 66. Curve 68 represents data measured from a comparable sample produced with continuous rotation at a normal orientation to generate a conventional, normally disposed columnar ceramic topcoat with equivalent overall topcoat thickness. As is readily apparent, thermal conductivity of the herringbone ceramic topcoat of curve 66 is substantially less than that of the conventional ceramic topcoat of curve 68. The average value of thermal conductivity for the herringbone topcoat data in the flat section of the curve 66 between about 200° C. and about 1100° C. is about 1.13 W/mK; whereas, the average of the data of the curve 68 for the conventional topcoat within this range is about 1.66 W/mK. This data demonstrates the herringbone ceramic topcoat provides a greater than thirty percent improvement in thermal insulation for the same thickness as a conventional columnar ceramic topcoat.

The average thickness of individual layers of the multilayered ceramic topcoats and other TBC system layers depicted in FIGS. 2 and 3A–3D may be selected by those skilled in the art to achieve a desired insulative and mechanical result. In a typical application in a gas turbine engine 10 or other harsh environment, the thickness of bond coat 38 may be between about 40 and about 120 microns; the thickness of the alumina film 42 between about 0.1 and about 3 microns; and the overall thickness of the multilayered ceramic topcoat 44 between about 40 and about 350 microns. The multilayered ceramic topcoat 44 may include two to ten layers or more, each ranging in thickness from about 10 microns to about 100 microns and having respective grain orientation direction included angles ranging from greater than zero degrees to less than 180 degrees. These ranges are exemplary. Values outside these ranges, alone or in combination, are considered within the scope of the invention.

In a preferred embodiment for an airfoil of a gas turbine engine blade 32 or vane 30, the thickness of bond coat 38 may be between about 50 and about 80 microns; that of the alumina film 42 may be between about 0.5 and about 1.5 microns; and the overall thickness of the multilayered ceramic topcoat 44 may be between about 60 and about 150 microns. The multilayered ceramic topcoat 44 may include two to five layers each ranging in thickness from about 10 microns to about 100 microns and having respective grain orientation direction included angles ranging from greater than about 30 degrees to less than about 150 degrees.

Figure 4B:
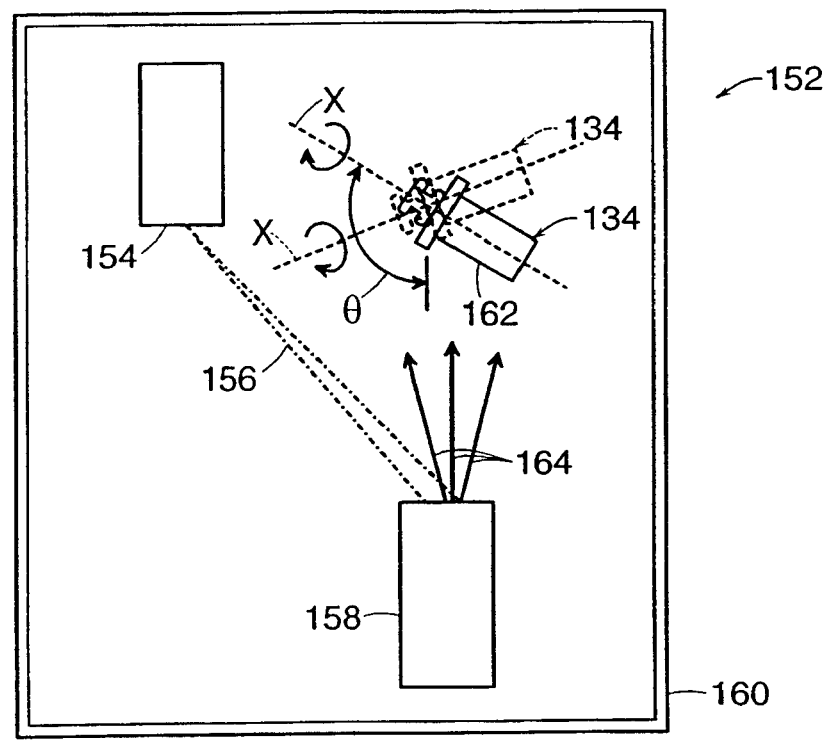
FIG. 4B is a schematic, cross-sectional view of a portion of an EB-PVD apparatus for producing a TBC in accordance with an alternative embodiment of the present invention.

As discussed hereinabove with respect to FIGS. 4A and 4B, depending on ceramic deposition rate and desired layer thicknesses, the article need not dwell absolutely motionless during coating deposition, but rather can continue in motion. Accordingly, this technique may be employed to produce an arcuate columnar grain microstructure. In yet another embodiment, the article may be repeatedly moved back and forth between first and second positions without dwelling to generate a sinusoidal columnar grain microstructure.

FIG. 7 is a graph of a square waveform 70 plotting article reorientation angle, $\theta$, as a function of time for producing a regular herringbone-type columnar ceramic structure and a graph of a sinusoidal waveform 72 for producing an arcuate sinusoidal-type columnar ceramic structure 544, such as that depicted in FIG. 8. The layers of the ceramic structure 544 exhibit alternating convex and concave arcuate grain orientations, with suitable smooth transitions therebetween. The schematic square waveform 70, having constant frequency and alternating magnitude, produces a substantially uniform, regular herringbone pattern, such as that depicted in FIG. 2. By changing the frequency, magnitude, and/or angular offset of the waveform 70 relative to nominal, the configuration of the herringbone pattern grain microstructure can be changed.

Similarly, the schematic sinusoidal waveform 72, having constant frequency and alternating magnitude, produces a substantially uniform, regular sinusoidal pattern 544. By changing the frequency, magnitude, and/or angular offset of the waveform 72 relative to nominal, the configuration of the sinusoidal microstructure can be changed.

FIG. 9 is a schematic representation of a three dimensional helical or screw-type of columnar grain microstructure in which columnar grains are produced with a twist. Such grain microstructures are considered to fall within the scope of arcuate grain microstructures discussed hereinabove. Rotation and reorientation of the article can be vectorized, such that orientation of the article relative to the vapor cloud direction can be simultaneously controlled. According to one embodiment, the article can be rotated according to a sinusoidal waveform while the article is being reoriented according to a second sinusoidal waveform subject to a 90 degree phase shift. Alternatively or additionally, a second reorientation axis in the positioning apparatus can be employed in concert with the primary reorientation axis to produce a desired result. The second reorientation axis may be disposed in a plane perpendicular to that of the first reorientation axis.

While square and sinusoidal waveforms have been disclosed, other waveforms may be used, alone or in combination, to produce a variety of two-dimensional and three-dimensional columnar grain microstructures, either with or without article rotation. Examples include those which change frequency, magnitude, and/or angular offset relative to nominal, as a function of time.

While it is possible that the thermal conductivity of arcuate columnar microstructures, and related sinusoidal and hemispherical microstructures, may be slightly higher than the thermal conductivity of herringbone microstructures, these microstructures may be mechanically tougher, finding application on articles with high magnitude thermomechanical loads. Because the thermal conductivity perpendicular to the columnar grains tends to be relatively low, the thermal conductivity of the ceramic topcoat may be inversely proportional to grain length.

While there have been described herein what are to be considered exemplary and preferred embodiments of the present invention, other modifications of the invention will become apparent to those skilled in the art from the teachings herein. It is therefore desired to be secured in the appended claims all such modifications as fall within the spirit and scope of the invention. Accordingly, what is desired to be secured by Letters Patent is the invention as defined and differentiated in the following claims.

What is claimed is:

1. A ceramic coating comprising:
 a first ceramic layer having a curved columnar grain microstructure with grain orientation direction and a second ceramic layer disposed thereon having a curved columnar grain microstructure with a different grain orientation direction.

2. The invention according to claim 1 wherein the ceramic coating comprises a substantially sinusoidal columnar grain microstructure.

3. The invention according to claim 1 wherein the ceramic coating comprises a substantially helical columnar grain microstructure.

4. A method of producing a ceramic topcoat of a thermal barrier coating system on a substrate, the method of comprising the steps of:
 a) providing a substrate at a first orientation relative to a source of ceramic vapor;
 b) depositing a first ceramic layer on the substrate while moving the substrate from the first orientation to a second orientation to produce a curved columnar grain microstructure with a first curved grain orientation direction; and
 c) depositing a second ceramic layer on the substrate while moving the substrate from the second orientation to the first second orientation to produce a curved columnar grain microstructure with a different curved grain orientation direction.

5. The invention according to claim 4 wherein the ceramic topcoat produced comprises a substantially sinusoidal columnar grain microstructure.

6. The invention according to claim 4 wherein the ceramic topcoat produced comprises a substantially helical columnar grain microstructure.

7. A coated substrate produced according to the method of claim 4.

8. A thermal barrier coating system comprising:
 a bond coat;
 an alumina layer on the bond coat; and
 a ceramic topcoat on the alumina layer, the ceramic topcoat comprising a first ceramic layer having a curved columnar grain microstructure with a curved grain orientation direction and a second ceramic layer disposed on the first ceramic layer, the second ceramic layer having a curved columnar grain microstructure with a different curved orientation direction.

9. The invention according to claim 8 wherein the ceramic topcoat comprises a substantially sinusoidal columnar grain microstructure.

10. The invention according to claim 8 wherein the ceramic topcoat comprises a substantially helical columnar grain microstructure.

11. A coated article comprising:
 a substrate; and
 a thermal barrier coating system on the substrate, the thermal barrier coating system comprising:
 a bond coat on the substrate;
 an alumina layer on the bond coat; and
 a ceramic topcoat on the alumina layer, the ceramic topcoat comprising a first ceramic layer having a curved columnar grain microstructure with a curved grain orientation direction and a second ceramic layer disposed on the first ceramic layer, the second ceramic layer having a curved columnar grain microstructure with a different curved grain orientation direction.

12. The invention according to claim 11 wherein the ceramic topcoat comprises a substantially sinusoidal columnar grain microstructure.

13. The invention according to claim 11 wherein the ceramic topcoat comprises a substantially helical columnar grain microstructure.

14. The invention according to claim 11 wherein the substrate comprises a superalloy selected from the group consisting of nickel-base superalloy and cobalt-base superalloy.

15. The invention according to claim 11 wherein the coated article comprises an engine part, at least a portion of which is exposed to combustion effluent during operation thereof.

16. The invention according to claim 15 wherein the engine part is selected from the group consisting of combustors, turbine blades, turbine vanes, turbine frames, and exhaust nozzles.

17. A thermal barrier coating system comprising:
a bond coat for applying to a substrate;
an alumina layer on the bond coat; and
a ceramic topcoat on the alumina layer comprising a plurality of superposed ceramic layers, each layer having a grain orientation direction which differs from its abutting layers and forming a columnar grain microstructure with intercolumnar gaps which extend at least substantially down to the alumina layer.

18. The system according to claim 17, wherein the different grain orientation directions are in a zig-zag pattern to define a herringbone-type columnar ceramic structure.

19. The system according to claim 17, wherein the different grain orientation directions are in an alternating convex and concave pattern to define a sinusoidal columnar ceramic structure.

20. The system according to claim 17, wherein the different grain orientation directions are in a curved pattern to define a helical columnar ceramic structure.

21. A coated article comprising:
a substrate; and
a thermal barrier coating applied to the substrate comprising a bond coat for on the substrate;
an alumina layer on the bond coat; and
a ceramic topcoat on the alumina layer comprising a plurality of superposed ceramic layers each layer having a grain orientation direction which differs from its abutting layers and forming a columnar grain microstructure with intercolumnar gaps which extend at least substantially down to the alumina layer.

22. The coated article according to claim 21, wherein the different grain orientation directions are in a zig-zag pattern to define a herringbone-type columnar ceramic structure.

23. The coated article according to claim 21, wherein the different grain orientation directions are in an alternating convex and concave pattern to define a sinusoidal columnar ceramic structure.

24. The coated article according to claim 21, wherein the different grain orientation directions are in a curved pattern to define a helical columnar ceramic structure.

25. The coated article according to claim 21, wherein the substrate a superalloy selected from the group consisting of nickel-base superalloy and cobalt-base superalloy.

26. The coated article according to claim 21, wherein the coated article comprises an engine part.

27. The coated article according to claim 26, wherein the engine part is selected from the group consisting of combustors, turbine blades, turbine vanes, turbine frames, and exhaust nozzles.

28. A method for producing a thermal barrier coating system comprising the steps of:
applying a bond coat to a substrate;
applying an alumina layer on the bond coat; and
applying a ceramic topcoat on the alumina layer by applying a plurality of superposed ceramic layers thereon, each layer having a grain orientation direction which differs from its abutting layers and forming a columnar grain microstructure with intercolumnar gaps which extend at least substantially down to the alumina layer.

29. The system according to claim 28, wherein the different grain orientation directions are in a zig-zag pattern to define a herringbone-type columnar ceramic structure.

30. The system according to claim 28, wherein the different grain orientation directions are in an alternating convex and concave pattern to define a sinusoidal columnar ceramic structure.

31. The system according to claim 28, wherein the different grain orientation directions are in a curved pattern to define a helical columnar ceramic structure.

* * * * *